United States Patent
Ostrowski

[19]

[11] Patent Number: 6,072,397

[45] Date of Patent: Jun. 6, 2000

[54] METHOD AND APPARATUS FOR REDUCING FLAME EMISSIONS FROM AN ELECTRONICS ENCLOSURE

[75] Inventor: Gary Ostrowski, Danville, N.H.

[73] Assignee: Ascend Communications, Inc., Alameda, Calif.

[21] Appl. No.: 09/204,704

[22] Filed: Dec. 3, 1998

[51] Int. Cl.$^7$ .............................. G08B 17/00; F24F 7/00
[52] U.S. Cl. .................... 340/588; 340/584; 454/257; 236/49.2; 236/49.3
[58] Field of Search ................... 340/588, 589, 340/577–579, 584–586, 607; 361/688, 687, 694, 695; 454/184, 257, 258; 237/46; 236/49.1, 49.2, 49.3, DIG. 9, DIG. 19; 374/9

[56] References Cited

U.S. PATENT DOCUMENTS

| | | | |
|---|---|---|---|
| 3,188,434 | 6/1965 | Numayama | 200/140 |
| 3,644,913 | 2/1972 | Matsui | 340/228 R |
| 3,809,855 | 5/1974 | Neal | 219/216 |
| 4,071,875 | 1/1978 | Kochem | 361/113 |
| 4,175,437 | 11/1979 | Burt | 73/362 AR |
| 4,361,799 | 11/1982 | Lutz | 324/52 |
| 4,377,837 | 3/1983 | Matsko et al. | 361/105 |
| 4,504,782 | 3/1985 | Zbinden | 324/73 PC |
| 4,544,982 | 10/1985 | Boothman et al. | 361/96 |
| 4,567,428 | 1/1986 | Zbinden | 324/73 PC |
| 4,600,962 | 7/1986 | Bliehall | 361/77 |
| 4,638,288 | 1/1987 | Remec | 340/52 F |
| 4,818,970 | 4/1989 | Natale et al. | 340/539 |
| 4,951,870 | 8/1990 | Ballard | 236/11 |
| 5,079,542 | 1/1992 | Umezawa | 340/587 |
| 5,102,040 | 4/1992 | Harvey | 236/49.3 |
| 5,372,426 | 12/1994 | Broudy et al. | 374/127 |
| 5,408,573 | 4/1995 | Jamieson et al. | 388/815 |
| 5,482,210 | 1/1996 | Carey et al. | 236/49.3 |
| 5,537,096 | 7/1996 | Wagner | 340/584 |
| 5,541,803 | 7/1996 | Pope, Jr. et al. | 361/103 |
| 5,548,464 | 8/1996 | Manning | 361/23 |
| 5,585,990 | 12/1996 | Manning et al. | 361/25 |
| 5,616,843 | 4/1997 | Schifferl et al. | 73/204.15 |
| 5,626,288 | 5/1997 | Huber | 236/49.3 |
| 5,906,315 | 5/1999 | Lewis et al. | 236/49.3 |
| 5,926,386 | 7/1999 | Ott et al. | 318/471 |

OTHER PUBLICATIONS

*Installing Protectowire Linear Heat Detector*, Design Guide Jan. 1997.

*NEBS Requirements: Physical Protection Environmental Test Methods*, Issue 1, Oct., 1995.

*Primary Examiner*—Donnie L. Crosland
*Attorney, Agent, or Firm*—Weingarten, Schurgin, Gagnebin & Hayes LLP

[57] ABSTRACT

A method and apparatus which reduces flame emissions from an electronics enclosure in the event of a fire within the enclosure. At least one fan is utilized to provide air flow along an air flow path between an air intake port and an air exhaust port of the enclosure. At least one heat sensor, such as a linear heat detector cable, detects an over-temperature condition within air flow path when the temperature in the air flow path exceeds a predetermined threshold temperature. The sensors are coupled to a fan controller. In response to the detection by the controller of the over-temperature condition indicated by one or multiple sensors disposed within the air flow path, the fans are disabled to avoid the fanning of flames within the enclosure and the exhaust of flames from the enclosure. The controller may also activate a indicator such as an alarm or warning light to make a user aware of the over-temperature condition and additionally may provide an electronic signal indicative of the over-temperature condition to system hardware or software to permit further alert messages to be provided.

30 Claims, 5 Drawing Sheets

METHOD AND APPARATUS FOR REDUCING FLAME EMISSIONS FROM AN ELECTRONICS ENCLOSURE

CROSS REFERENCE TO RELATED APPLICATIONS

Not Applicable

STATEMENT REGARDING FEDERALLY SPONSORED RESEARCH OR DEVELOPMENT

Not applicable

BACKGROUND OF THE INVENTION

The present invention relates to enclosures for electronic components and more specifically, to a method and apparatus for reducing flame emissions from such enclosures.

Electronic enclosures often include a plurality of fans for cooling electronic components mounted on printed circuit boards within such enclosures. The fans draw air into the enclosure at an air inlet port and cause the air to travel along an air flow path to an air exhaust port where the air exits the enclosure. The printed circuit boards are disposed in the air flow path and the components are cooled as the air flows across the boards.

In the event of a failure, it is possible for a circuit board to malfunction in such a manner as to ignite a fire on the malfunctioning board. The flames from the fire are fanned by the airflow produced from the fans and may exit the enclosure at the air exhaust port. Flames exiting the enclosure can ignite secondary fires and cause substantial damage. For this reason, it is important to minimize the emission of flames from electronics enclosures.

The Network Equipment Building System (NEBS) standard has been promulgated governing flame emissions from electronic network equipment enclosures. Section 4.2.2.1 of the NEBS GR-63-CORE requirements specifies, inter alia, that visible flames shall not extend beyond the horizontal or vertical confines of the equipment under test for 30 seconds or more. Compliance with this standard is tested by igniting a fire on a circuit board within the air flow path and determining whether flames extend beyond the enclosure for longer than the prescribed period. In practice compliance with this standard has proved difficult.

Various techniques for minimizing flame emissions from electronics enclosures have been employed. Baffles have been employed in an effort to redirect the flames. The use of baffles, however, undesirably increases back pressure and decreases cooling efficiency. In another approach to the solution of this problem, the amount of air permitted to enter the enclosure has been reduced by reducing the opening sizes at the air inlet or exhaust ports. These approaches also undesirably reduce the cooling efficiency. Additionally, none of the above described techniques adequately reduced flame emissions from the enclosure in a reliable manner so as to permit compliance with the aforementioned standard.

It would therefore be desirable to have a method and apparatus which minimized flame emissions from electronic cabinetry to reduce the risk of the ignition of secondary fires in the vicinity of such cabinetry.

BRIEF SUMMARY OF THE INVENTION

A method and apparatus is presented which reduces or eliminates flame emissions from an electronics enclosure. At least one fan is utilized to generate an air flow path from an air inlet port of the enclosure to an air exhaust port of the enclosure. At least one heat sensor, such as a linear heat detector cable, is disposed within the air flow path and provides an indication of an over-temperature condition in the event the temperature in the vicinity of the sensor has exceeded a predetermined temperature. Upon detection of the over-temperature condition, as would occur in the event of a fire along the air flow path, a signal is provided to a controller indicating the existence of the over-temperature condition. In response to the signal indicating the over-temperature condition, the controller disables the fans. The flames resulting from a fire are thus no longer fanned by the air flow produced by the fans and flame emissions from the air exhaust port are reduced.

In a preferred embodiment, redundant heat sensors are coupled to the controller and the fans are shut down by the controller only in the event that both heat sensors provide an indication of the over-temperature condition to the controller. In this manner, the fans are not disabled in the event of the erroneous indication of an over-temperature condition by one of the sensors. The controller may also activate an indicator such as a warning light and/or assert an error signal to make a user or an electronics system aware that an over-temperature condition has been detected.

BRIEF DESCRIPTION OF THE SEVERAL VIEWS OF THE DRAWING

The invention will be more fully understood from the following detailed description taken in conjunction with the accompanying drawings of which.

DETAILED DESCRIPTION OF THE INVENTION

A method and apparatus for reducing or eliminating flame emission from an electronics enclosure is disclosed. Fans are employed to generate airflow along an air flow path between an air inlet port and air exhaust port. The enclosure includes at least one heat sensor within the air flow path which detects the existence of an over-temperature condition within the enclosure. If the over-temperature condition is detected, the cooling fans are disabled to prevent the ongoing fanning of the flames of the fire ignited within the air flow path. Moreover, by disabling the fans, the fire is minimized and the exhaust of flames from the enclosure is reduced or eliminated.

Figure 1:
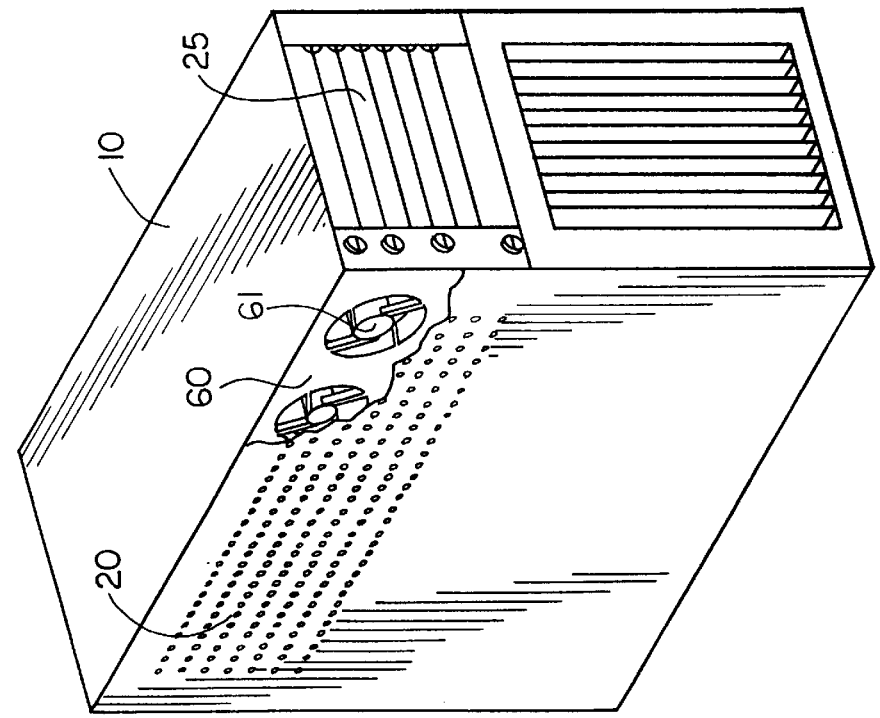
FIG. 1 is a partially cut-away perspective view of a prior art enclosure.

Referring to FIG. 1, a prior art electronics enclosure 10 is shown. The enclosure 10 includes an air intake port 20. The air intake port 20 comprises a plurality of holes which allow air to be drawn into the enclosure 10. The air intake port 20 may also comprise a plurality of slots or any other suitable configuration. The enclosure 10 further includes an air exhaust port (not shown in the present view). Similar to the air intake port 20, the air exhaust port allows air to be exhausted from the enclosure. The air exhaust port may also comprise a plurality of holes in the enclosure, slots or any other suitable configuration.

The enclosure 10 further includes a fan assembly 60 including at least one fan 61. The fan(s) 61 is(are) operative to draw air into the enclosure through the air intake port and to cause the air to travel along an air flow path before exiting the enclosure through the air exhaust port. Printed circuit boards 25 are mounted within the air flow path so as to provide for cooling of electronic components disposed on the respective boards.

Figure 2:
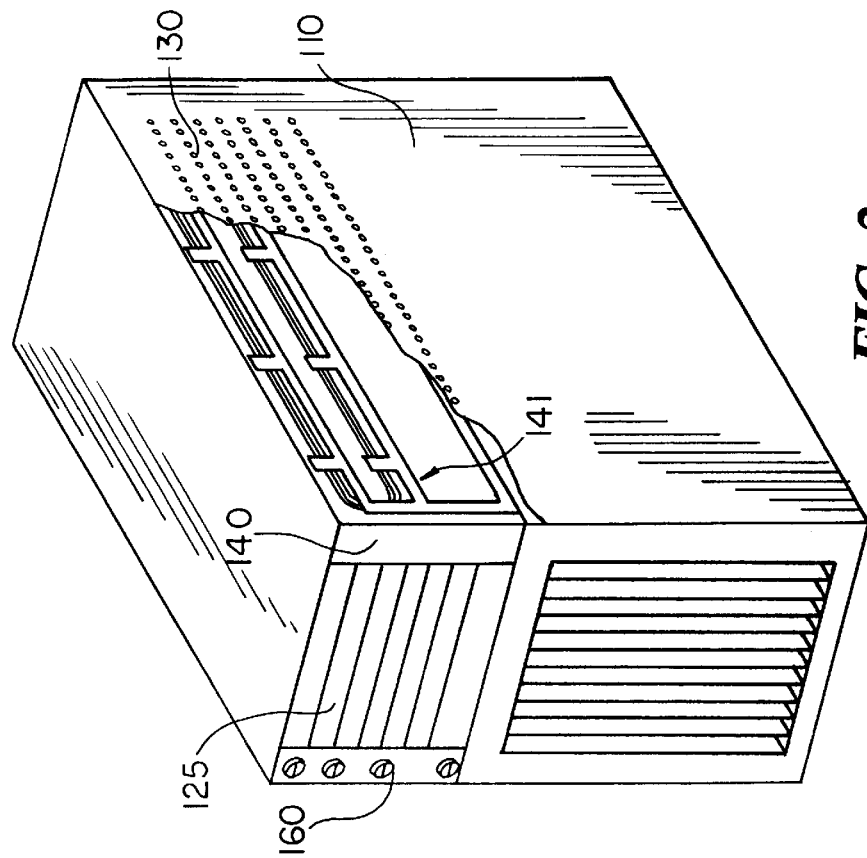
FIG. 2 is a partially cut-away perspective view of an enclosure and apparatus operative in accordance with the present invention.
Figure 3:
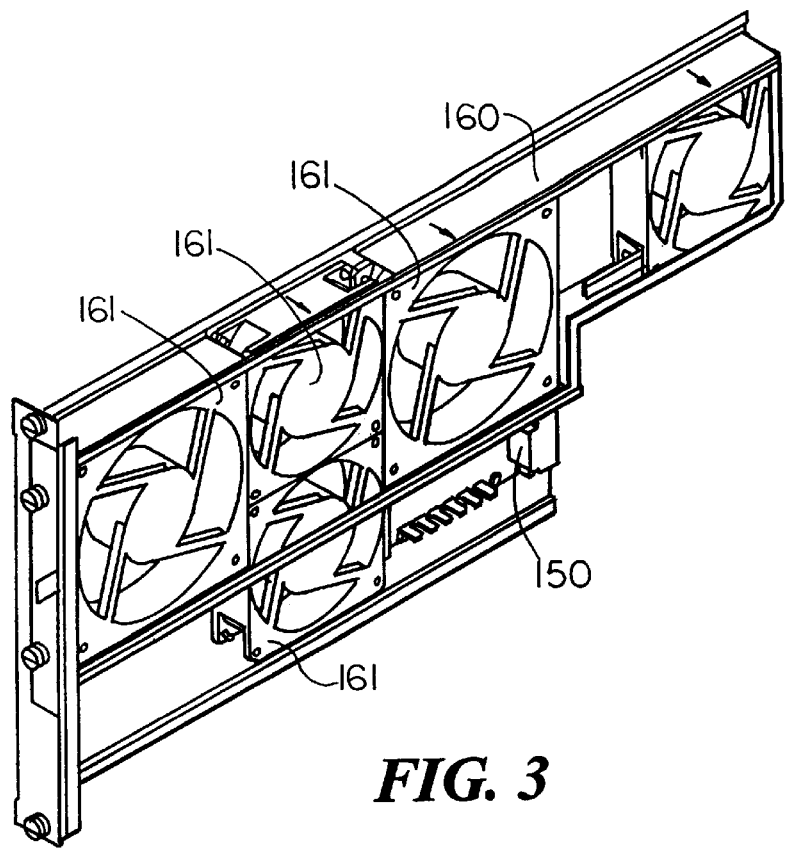
FIG. 3 is a perspective view of a fan assembly employed in the enclosure depicted in FIG. 2.

Referring now to FIG. 2, an electronics enclosure 110 is shown which includes apparatus for minimizing flame emission from the enclosure in the event a fire ignites within the enclosure. The enclosure 110 includes an air intake port (not shown in FIG. 2), an air exhaust port 130, a fan assembly 160 and a sensor assembly 140. The air intake port in FIG. 2 is positioned on the side of the enclosure opposing the side having the air exhaust port and is generally positioned as in the case of the air intake port depicted in FIG. 1. The fan assembly 160 is illustrated in FIG. 3. Referring to FIGS. 2 and 3, the fan assembly 160 includes at least one fan 161 for drawing air into the enclosure 110 through the air intake port and exhausting the air through the air exhaust port 130. The fan(s) thus generate an air flow path between the air intake port and the air exhaust port 130 which air flow may be generally laminar. As depicted in FIG. 2, printed circuit boards 125, are positioned in the air flow path to provide for cooling of the electronic components mounted on the respective boards.

In the presently disclosed embodiment, the fan assembly 160 is disposed generally adjacent the air intake port of the enclosure as illustrated in FIG. 2. As depicted in FIG. 3, the fan assembly 160 includes a metal frame and a plurality of fans 161 mounted thereto. The fans 161 may comprise A.C. or D.C. fans and may be of any size required to provide for the desired cooling of components mounted on the printed circuit boards within the air flow path. Fan assembly 160 further includes a controller 150 which is described below. The controller 150 is in electrical communication with the fans 161 and with the heat sensors of sensor assembly 140. More specifically, power is applied to the fans through the controller such that the controller can enable or disable operation of the respective fans.

Figure 4:
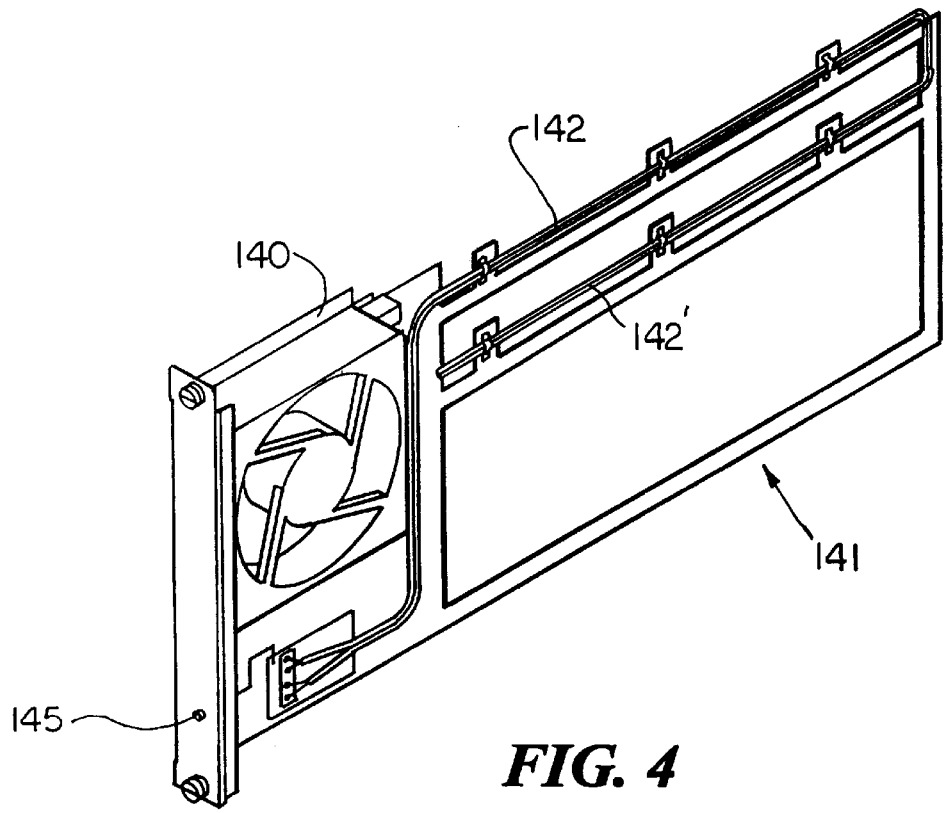
FIG. 4 is a perspective view of the heat sensor assembly employed within the enclosure depicted in FIG. 2.

The sensor assembly 140 is illustrated in FIG. 4. Sensor assembly 140 includes a frame 141 and a pair of sensors 142 and 142' mounted to the frame 141. The sensor assembly 140 is mounted within the enclosure 110 such that the sensors 142, 142' are disposed within the air flow path and adjacent the exhaust port 130. In a preferred embodiment each sensor comprises a linear heat detector cable. A linear heat detector cable includes a pair of conductive wires which are adjacent each other and isolated from each other by an insulator. One wire of the conductive wire pair is coupled to a predetermined voltage such as ground, Vcc or any other suitable voltage. The other wire is coupled to a controller as hereinafter discussed. The insulation within the heat detector cable is selected such that the insulation will melt and the conductive wires will short to one another when subjected to a predetermined temperature. The shorted condition of the wires, indicative of the over-temperature condition is thus detectable by the controller. Suitable heat detector cables are commercially available from The Protectowire Co., Inc. of Hanover, Mass. In a preferred embodiment, a heat detector cable includes heat detector cables in which the insulation melts and the conductive wires short at approximately 190 degrees fahrenheit. The sensors 142 and 142' are shown arranged in a serpentine manner on frame 41 though other arrangements could also be utilized. The sensor assembly 140 further includes a light emitting diode 145 which is activated by the controller 150 in response to an indication that an over-temperature condition has been detected by at least one of the sensors 142 and 142'.

Figure 5:
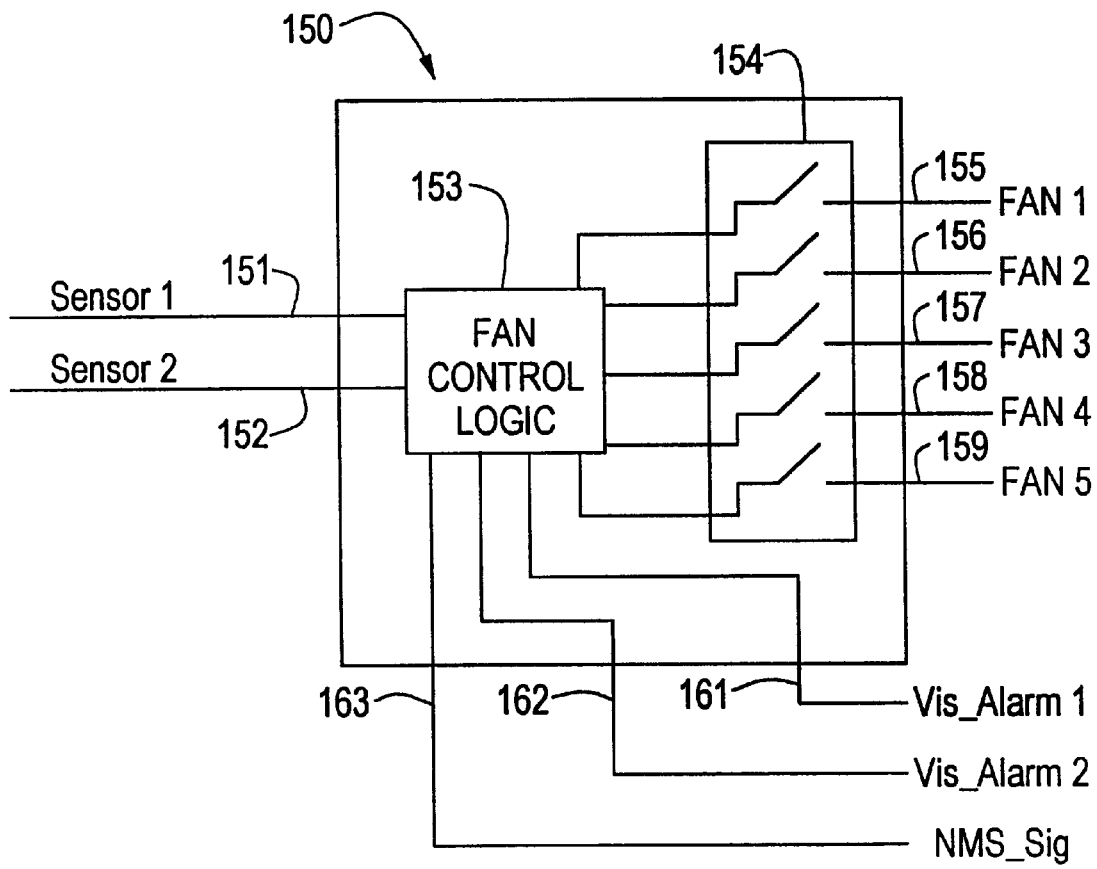
FIG. 5 is a block diagram depicted the controller and controller inputs and outputs employed within the enclosure depicted in FIG. 2.

As depicted in FIG. 5, at least one of the leads from each sensor 142 and 142' is in electrical communication with the controller 150. If either sensor 142 or 142' detects an over-temperature condition within the air flow path, such as would result in the event of a fire within the relevant portion of the enclosure 110, one light emitting diode disposed on the fan assembly 160 is activated by the controller 150 via signal Vis_Alarm 1 161 and a second light emitting diode 145 mounted on the sensor assembly 140 is activated by the controller 150 via signal Vis_Alarm 2 162. Additionally, if either sensor 142 or 142' detects an over-temperature condition within the air flow path, the controller 150 asserts a fault indicator signal NMS_Sig 163 to provide an indication to system electronics or software that an over-temperature condition has been detected. In the event that both sensors 142 and 142' indicate an over-temperature condition to the controller 150, the controller 150 activates the visual displays, asserts the fault indicator signal NMS_Sig 163 and disables the fans 161. Thus, the fan(s) is(are) only disabled if both sensors 142 and 142' detect the over-temperature condition. Thus, if one of the sensors malfunctions and falsely indicates an over-temperature condition, the warning lights are lit and the fault signal asserted, however the fan remains activated and the cooling of the electronic circuits within the enclosure is maintained. Such redundancy is particularly important in electronic equipment of substantial value which might be damaged as a consequence of an over-temperature condition induced not by a fire, but rather, as a result of a false indication by one of the sensors. If such redundancy is not deemed necessary, a single sensor may be employed and the fans may be disabled in the event of the indication of the over-temperature condition by a single sensor.

The controller 150 is depicted in FIG. 5 and includes fan control logic 153 which may comprise a microprocessor operative to execute a control program stored in a memory, a gate array, or any other suitable form of control logic operative to provide the presently described control functions. The fan control logic 153 receives as inputs at least one signal over leads Sensor1 151 and Sensor2 152 and provides a number of control outputs. More specifically, the fan control logic 153 provides an output signal Vis-Alarm1 161 for lighting a first visual display device such as a light emitting diode (LED), an output signal Vis-Alarm2 162 for lighting a second visual display such as a light emitting diode and a NMS-SIG signal 163 for indicating an error condition to system hardware or software. Fan control logic 153 also provides output signals 155–159 which control power to respective fans 161 of the fan assembly 160. As described above, when fan control logic 153 receives a signal on either the lead Sensor1 151 or the lead Sensor2 152, the Vis-Alarm1 signal 161 and Vis_Alarm2 signal 162 are asserted to activate the respective visual displays so as to provide a visual indication of the over-temperature condition. The fan control logic 153 also asserts the NMS-SIG signal 163 to indicate an error condition, such as to system hardware or software as described above. If both the Sensor1 signal 151 and the Sensor2 signal 152 are asserted then the control logic 153 disconnects power to the respective fans via the fan switch array 154. The disconnection of power to the fans upon the detection of an over-temperature condition by both sensors shuts down the air flow through the enclosure. Shutting down the fans reduces the air flow along the air flow path. Thus, fanning of flames ceases and exhaust of flames from the exhaust port of the enclosure as a result of the air flow is eliminated.

By disabling the fans in the event of a fire within the enclosure, the enclosure compliance with the Network Equipment Building System (NEBS) Standard GR-63-CORE section 4.2.2.1 Firespread Criteria, Issue 1, October 1995 is facilitated. It should be appreciated that the presently disclosed method and apparatus may be employed to achieve the desired objectives in equipment other than network equipment to which the above referenced NEBS standard applies.

Figure 6:
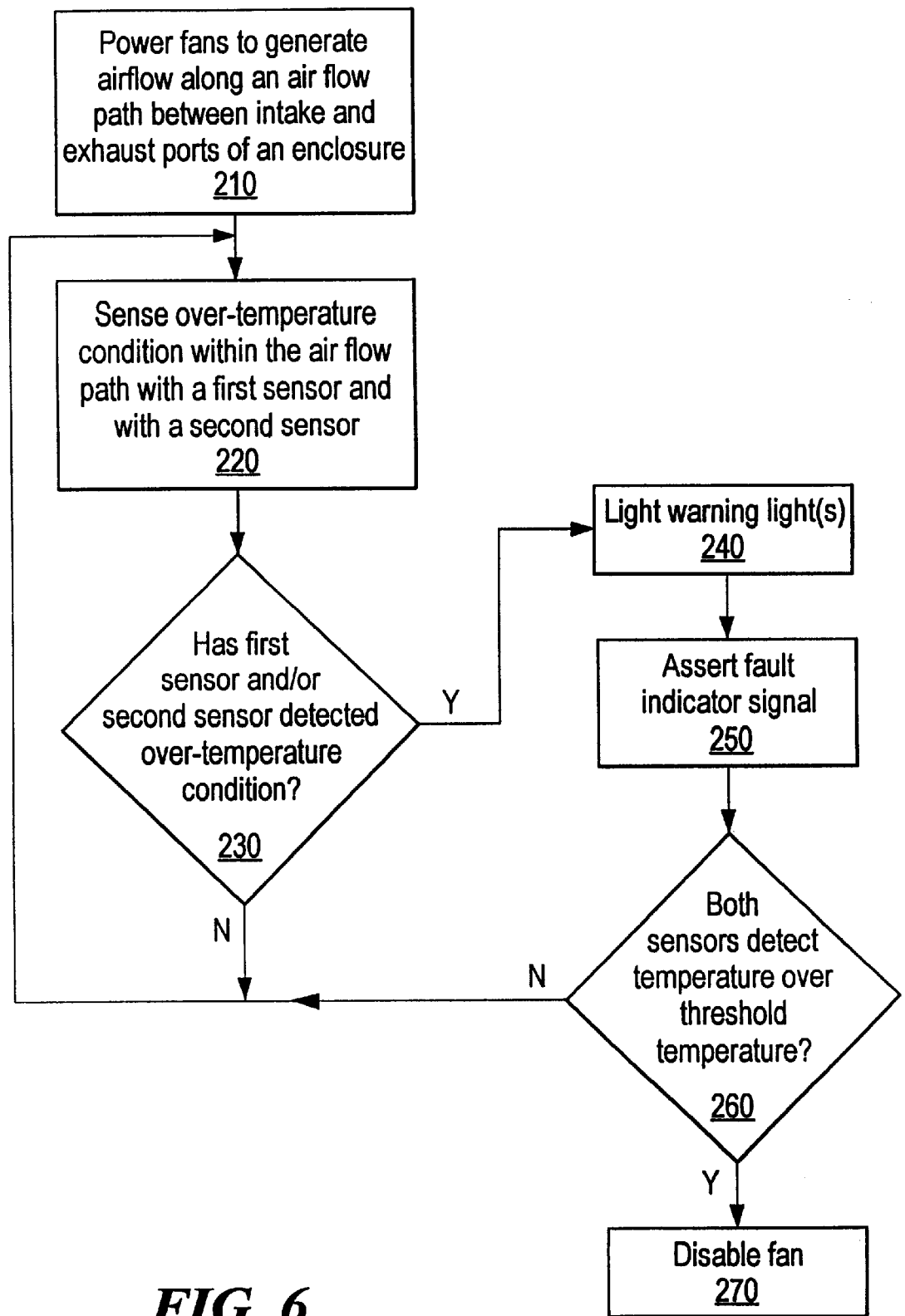
FIG. 6 is a flow chart illustrating a method of operation of a first embodiment of the present invention.

One embodiment of the presently disclosed method for minimizing flame emission from electronics equipment enclosure is illustrated in FIG. 6. As depicted in step 210, fans are powered within an enclosure to generate air flow along an air flow path between an air intake port and an air exhaust port. As illustrated in step 220, first and second sensors within the air flow path are employed to provide an indication of an over-temperature condition with the air flow path. The sensors are redundant and provide a fail-safe mechanism if one sensor malfunctions and falsely indicates an over-temperature condition within the enclosure. As depicted in decision step 230, a determination is made if either sensor has detected an over-temperature condition. If neither sensor has detected an over-temperature condition, step 220 is repeated. If either sensor detects an over-temperature condition as illustrated in step 230, a visual display is activated as shown in step 250 and a fault indicator signal is asserted, as shown in step 250. It should be appreciated that the ordering of steps 240 and 250 is a matter of choice.

As depicted in decision step 260, inquiry is made as to whether a single sensor or both sensors are indicating an over-temperature condition, as illustrated in step 270. Upon a determination that both sensors have detected an over-temperature condition, the fans are disabled. Upon a determination that only one sensor is indicating an over-temperature condition, step 220 is repeated.

Figure 7:
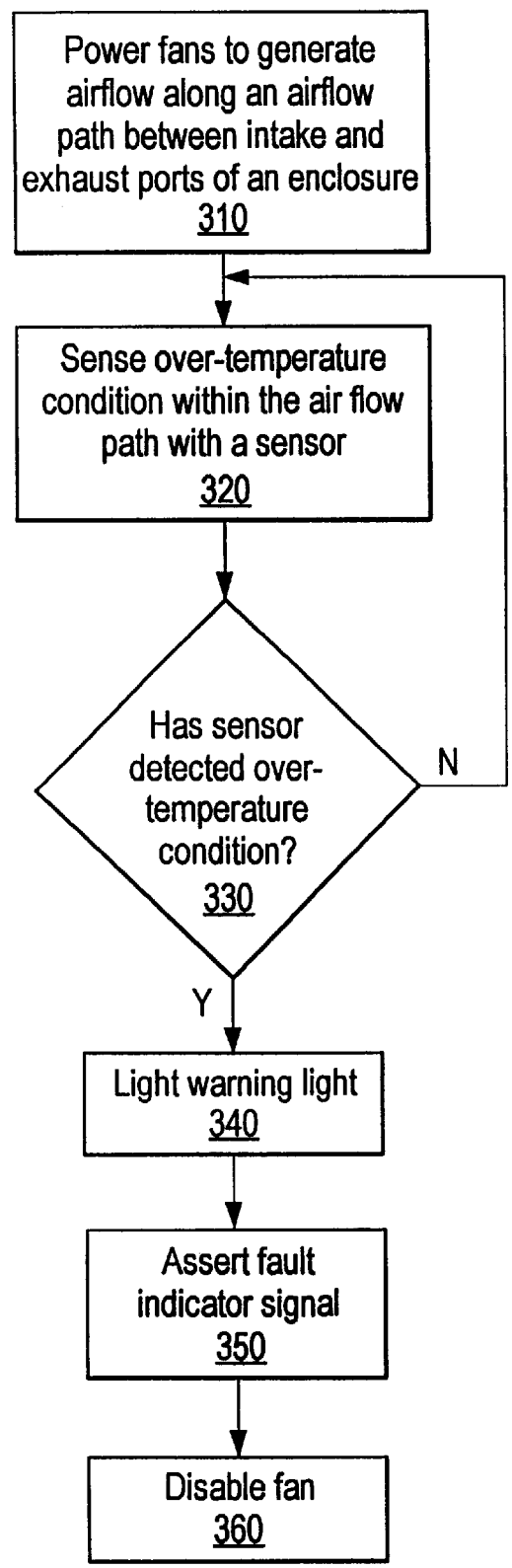
FIG. 7 is a flow chart illustrating a method of operation of a second embodiment of the present invention.

Referring now to FIG. 7, another method in accordance with the present invention which employs a single sensor is illustrated. As depicted in step 310 fans are powered to generate air flow along an air flow path between intake and exhaust ports of an electronics enclosure. As illustrated in step 320, a sensor within the air flow path is employed to provide a signal indicative of an over-temperature condition, such as caused by a fire within the enclosure. As depicted in decision step 330, upon a determination that the sensor is not indicating an over-temperature condition, step 320 is repeated. Upon a determination that the sensor is indicating an over-temperature condition, a controller activates a warning light as shown is step 340, the controller asserts a fault indicator signal as illustrated in step 350 and the fans responsible for generation of the air flow along the air flow path are disabled.

By use of the methods described with respect to FIGS. 6 or 7, the fans are disabled upon detection of an over-temperature condition likely to accompany a fire, thus preventing the fanning of flames within the enclosure and reducing the likelihood that flames will be emitted from the enclosure.

While the present embodiments depict a horizontal air flow path it should be apparent that a vertical air flow path may also be provided. Moreover, multiple air flow paths may be provided within an electronics enclosure with separate fans employed to generate the air flow along each path. Where multiple air flow paths are present within a single enclosure, over-temperature conditions may be detected and the fans associated within the affected air flow path disabled. While the present embodiment describes linear heat detector cables as the preferred temperature sensors, other types of temperature sensors such as thermistors, thermostats or any other suitable temperature sensor coupled to appropriate control circuitry adapted to sense and provide an indication of an over-temperature condition may be used.

Having described preferred embodiments of the invention it will be apparent to those of ordinary skill in the art that modifications of and variation to the disclosed embodiments may be made without departing from the inventive concepts disclosed herein. Accordingly, it is submitted that the invention should not be limited to the described embodiments but rather should be limited only by the scope and spirit of the appended claims.

We claim:

1. Flame emission control apparatus comprising:

an electronics enclosure having at least one air intake port and at least one air exhaust port;

at least one fan operative to provide air flow along an air flow path between said at least one air intake port to said at least one air exhaust port;

at least one printed circuit board having electronic components mounted thereon, said printed circuit board disposed within said electronics enclosure and within said air flow path, said at least one fan operative to cool said electronic components in response to said air flow;

a heat sensor operative to provide an over-temperature signal indicative that the temperature within the air flow path has exceeded a predetermined value;

a controller in electrical communication with said heat sensor, said controller operative in response to receipt of said over-temperature signal to disable said at least one fan.

2. The apparatus of claim 1 wherein said heat sensor comprises a linear heat detector cable.

3. The apparatus of claim 1 wherein said sensor is disposed within said air flow path adjacent one of said at least one air exhaust port.

4. The apparatus of claim 1 wherein said air flow path is generally laminar.

5. The apparatus of claim 1 wherein said controller is operative in response to receipt of said over-temperature signal to generate a signal indicative of said over-temperature condition.

6. The apparatus of claim 2 wherein said linear heat detector cable is disposed in a serpentine manner at least partially within said air flow path.

7. The apparatus of claim 5 further comprising a visual indicator and wherein said signal indicative of said over-temperature condition is employed to activate said visual indicator.

8. The apparatus of claim 6 wherein said visual indicator comprises a light emitting diode.

9. Apparatus for reducing flame emissions from an electronics enclosure comprising:

an enclosure having at least one air intake port and at least one air exhaust port;

at least one fan operative to generate air flow along an air flow path between said at least one air intake port and said at least one air exhaust port;

a first heat sensor disposed within said air flow path and operative to provide a first indication of an over-temperature condition when the temperature in the vicinity of said first heat sensor exceeds a threshold temperature;

a second heat sensor disposed within said air flow path and operative to provide a second indication of an over-temperature condition when the temperature in the vicinity of said second heat sensor exceeds said threshold temperature;

a controller in electrical communication with said first and second heat sensors, said controller operative in response to receipt of at least one of said first and second indications to disable said at least one fan.

10. The apparatus of claim 9 wherein at least one of said first and second heat sensors comprise a linear heat detector cable.

11. The apparatus of claim 10 wherein at least one of said first and second heat sensors are disposed adjacent said air exhaust port.

12. The apparatus of claim 10 wherein said air flow path is laminar.

13. The apparatus of claim 9 wherein said controller is operative in response to receipt of at least one of said first and second indications to generate at least one indicator output signal indicative of said over-temperature condition.

14. The apparatus of claim 13 further comprising a visual display indicator wherein one of said at least one indicator output signal is employed to activate said visual display to provide a visual indication of said over-temperature condition.

15. The apparatus of claim 14 wherein said visual display indicator comprises a light emitting diode.

16. A method for reducing flame emissions from an electronics enclosure containing at least one printed circuit board, said method comprising the steps of:

powering at least one fan to generate air flow along an air flow path between an air intake port and an air exhaust port of said enclosure, said air flow path passing said printed circuit board to cool electronic components mounted on said printed circuit board;

generating an over-temperature signal with a sensor disposed within said air flow path when the temperature within the vicinity of said sensor exceeds a predetermined threshold temperature;

disabling the at least one fan in response to said over-temperature signal.

17. The method of claim 16 wherein said generating step comprises the step of generating said over-temperature signal with a linear heat detector cable disposed at least partially within said air flow path.

18. The method of claim 17 wherein said linear heat detection cable comprises first and second conductive leads separated by insulation, said first lead is coupled to a first predetermined voltage, and said over-temperature signal is detected on said second lead upon the melting of insulation and the shorting of said first and second conductive leads.

19. The method of claim 16 further comprising the step of activating an indicator in response to said over-temperature signal.

20. The method of claim 19 wherein said step of activating said indicator comprises the step of activating a visual indicator.

21. The method of claim 20 wherein said step of activating a visual indicator comprises the step of activating a light emitting diode.

22. The method of claim 16 further comprising the step of generating an output signal in response to detection of said over-temperature signal and sensing said output signal via use of system software.

23. A method for reducing flame emissions from an electronics enclosure comprising the steps of:

powering at least one fan to generate air flow along an air flow path between an air intake port and an air exhaust port of said enclosure;

in a first generating step, generating, with a first sensor, a first signal indicative of an over-temperature condition when the temperature within said air flow path exceeds a first predetermined value;

in a second generating step, generating, with a second sensor, a second signal indicative of an over-temperature condition when the temperature within said air flow path exceeds said first predetermined value;

disabling the at least one fan upon detection of at least one of said first and second signals, such that said at least one fan is disabled when both said first and second sensors are providing an indication of said over-temperature condition.

24. The method of claim 23 wherein said disabling step comprises the step of disabling the at least one fan upon detection of both of said first and second signals.

25. The method of claim 23 wherein said first generating step comprises the step of generating, with a first linear heat detector cable, said first signal indicative of an over-temperature condition when the temperature within said air flow path exceeds said first predetermined value.

26. The method of claim 25 wherein said second generating step comprises the step of generating, with a second linear heat detector cable, said second signal indicative of an over-temperature condition when the temperature within said air flow path exceeds said first predetermined value.

27. The method of claim 26 further comprising the step of activating an indicator in response to detection of at least one of said first and second signals.

28. The method of claim 27 wherein said step of activating an indicator comprises the step of activating a visual display.

29. The method of claim 28 wherein said step of activating a visual display comprises activating a light emitting diode.

30. A method for reducing flame emissions from an electronics enclosure comprising the steps of:

powering at least one fan to generate air flow along an air flow path between an air intake port and an air exhaust port of said enclosure;

in a first generating step, generating, with a first linear heat detector cable comprising first and second conductive leads wherein said first detector first lead is coupled to a predetermined voltage, a first detector output signal on said first detector second lead indicative of an over-temperature condition when the temperature within said air flow path exceeds a first predetermined value;

in a second generating step, generating, with a second linear heat detector cable comprising first and second conductive leads wherein said second detector first lead is coupled to a predetermined voltage, a second detector output signal on said second detector second lead indicative of an over-temperature condition when the temperature within said air flow path exceeds said first predetermined value;

in response to detection of at least one of said first detector and second detector output signals, generating an alarm signal indicative of an over-temperature condition and providing an indication of such condition in response to said alarm signal;

disabling the at least one fan upon detection of said first and second detector output signals, such that said at least one fan is disabled only when both said first and second sensors are providing an indication of said over-temperature condition.

* * * * *